United States Patent
Ma

(10) Patent No.: US 9,454,552 B2
(45) Date of Patent: Sep. 27, 2016

(54) ENTROPY CODING AND DECODING USING POLAR CODES

(75) Inventor: Xudong Ma, Monterey Park, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 521 days.

(21) Appl. No.: 13/816,075

(22) PCT Filed: Jul. 31, 2012

(86) PCT No.: PCT/US2012/048955
§ 371 (c)(1),
(2), (4) Date: Feb. 8, 2013

(87) PCT Pub. No.: WO2014/021837
PCT Pub. Date: Feb. 6, 2014

(65) Prior Publication Data
US 2014/0040214 A1 Feb. 6, 2014

(51) Int. Cl.
*G06F 17/30* (2006.01)
*H03M 7/30* (2006.01)
*H03M 13/11* (2006.01)
*H03M 13/13* (2006.01)

(52) U.S. Cl.
CPC .......... *G06F 17/30312* (2013.01); *H03M 7/30* (2013.01); *H03M 7/55* (2013.01); *H03M 13/1191* (2013.01); *H03M 13/13* (2013.01)

(58) Field of Classification Search
CPC ................................................ G06F 17/30153
See application file for complete search history.

(56) References Cited

U.S. PATENT DOCUMENTS

| | | | |
|---|---|---|---|
| 3,938,082 A * | 2/1976 | Schowe, Jr. | ........ H04L 25/4904 375/333 |
| 5,675,666 A | 10/1997 | Komuro et al. | |
| 7,209,590 B2 | 4/2007 | Lee et al. | |
| 2003/0007694 A1 | 1/2003 | Lee et al. | |
| 2007/0195952 A1 | 8/2007 | Singanamala | |
| 2009/0140894 A1 | 6/2009 | Schneider | |
| 2010/0119167 A1 | 5/2010 | Ikeda et al. | |
| 2010/0281079 A1 | 11/2010 | Marwah et al. | |
| 2011/0058474 A1 | 3/2011 | Nagapudi et al. | |

OTHER PUBLICATIONS

International Search Report & Written Opinion dated Nov. 5, 2012 in PCT Application No. PCT/US12/48955.
Ancheta, Jr., T. C., "Syndrome-source-coding and its universal generalization," IEEE Transactions on Information Theory, vol. IT-22, No. 4, Jul. 1976.

(Continued)

*Primary Examiner* — Grace Park
(74) *Attorney, Agent, or Firm* — Turk IP Law, LLC

(57) ABSTRACT

Technologies are described herein for compressing or decompressing data using polar codes. Some example technologies may receive a data string comprising a first set of symbols. The technologies may transform the data string into a generalized message comprising a second set of symbols by mapping the data string to the generalized message via an inverse of a transformation function. The technologies may identify, based on a polar code, fixed symbols of the generalized message. The technologies may generate a compressed data string by extracting the fixed symbols from the generalized message and concatenating the fixed symbols into the compressed data string. As a result, the generalized message may be transformed into the compressed data string.

16 Claims, 8 Drawing Sheets

(56) References Cited

OTHER PUBLICATIONS

Andersson, M. et al., "Nested Polar Codes for Wiretap and Relay Channels," IEEE Communication Letters, vol. 14, No. 8, pp. 752-754, Aug. 2010. [http://arxiv.org/abs/1006.3573].

Arikan, E., "Channel Polarization: A Method for Constructing Capacity-Achieving Codes for Synthetic Binary-Input Memoryles Channel," IEEE Transactions on Information Theory, Jul. 2009. [arxiv.org/abs/0807.3917].

Bakshi, S. et al., "Efficient Codes Based on Channel Polarization," Presentation at the 2010 IEEE summer school of information theory.

Hussami, N. et al., "Performance of Polar Codes for Channel and Source Coding," Proceedings of the IEEE Symposium on Information Theory, 2009.

Korada, S., "Polar Codes for Channel and Source Coding," PhD. thesis, EPFL 2009.

Koyluoglu, O. et al., "Polar Coding for Secure Transmission and Key Agreement," Proceedings of the IEEE 21st International Symposium on Personal Indoor and Mobile Radio Communications, 2010.

Mahdavifar, H. et al., "Achieving the Secrecy Capacity of Wiretap Channels Using Polar Codes," Proceedings of the IEEE International Symposium on Information Theory, 2010.

Weiss, E., "Compression and Coding," IRE Transactions on Information Theory, pp. 256-257, 1962.

Allard, P. E., and Bridgewater, A. W., "A source encoding technique using algebraic codes," Proceedings 1972 Canadian Computer Conference, pp. 201-213 (Jun. 1972).

\* cited by examiner

ENTROPY CODING AND DECODING USING POLAR CODES

CROSS-REFERENCE TO RELATED APPLICATION

This Application is the U.S. National Stage filing under 35 U.S.C. § 371 of PCT Application No. PCT/US12/48955 filed on Jul. 31, 2012, the contents of which are herein incorporated by reference in its entirety.

BACKGROUND

Unless otherwise indicated herein, the materials described in this section are not prior art to the claims in this application and are not admitted to be prior art by inclusion in this section.

Generally, entropy coders may refer to technologies adapted to map a string of symbols with statistical redundancy into an efficient representation by removing the statistical redundancy. An illustrative entropy coder may map a binary substring of a "0000" to a substring of "0", a binary substring of "0" to a substring of "10", a binary substring of 1" to a substring of "11". For example, this entropy coder may map a binary string of 0000001000000001 to a compressed representation of "01010110011". Thus, this entropy coder can remove statistical redundancy in binary strings containing substantially more zero values than one values.

Conventional entropy coders may have higher computational complexities. In one example, some conventional entropy coders, such as arithmetic coders, may utilize floating point operations. In another example, some other conventional entropy coders, such as Huffman coders, may utilize large mapping tables. These higher computational complexities may not be suitable for implementations that might benefit from data compression but also desire or demand lower costs or faster processing speeds afforded by lower computational complexities.

SUMMARY

The present disclosure generally describes techniques for compressing data. Some example methods may receive a data string including a first set of symbols. Example methods may transform the data string into a generalized message including a second set of symbols by mapping the data string to the generalized message via an inverse of a transformation function. Example methods may identify, based on a polar code, fixed symbols of the generalized message. Example methods may generate a compressed data string by extracting the fixed symbols from the generalized message and concatenating the fixed symbols into the compressed data string. As a result, the generalized message may be transformed into the compressed data string.

The present disclosure generally further describes some computer-readable storage media adapted to decompress data. The computer-readable storage media may include computer-executable instructions stored thereon which, when executed by a computer, cause the computer to perform one or more operations. Some example computer-executable instructions may cause the computer to receive a compressed data string including a first set of symbols. Example computer-executable instructions may cause the computer to define a base data string including zero values. Example computer-executable instructions may cause the computer to perform a polar decoding on the base data string to identify free symbols in a generalized message. Example computer-executable instructions may cause the computer to generate the generalized message including a second set of symbols by combining the compressed data string and the free symbols. As a result, the compressed data string may be transformed into the generalized message. Example computer-executable instructions may cause the computer to transform the generalized message into the data string by mapping the generalized message to the data string via a transformation function.

The present disclosure generally also describes some computer systems adapted to compress data. Some example computer systems include a processor, a memory coupled to the processor, and a program module which executes in the processor from the memory and which, when executed by the processor, causes the computer system to perform one or more operations. Some example program modules may cause the computer to receive a data string including a first set of symbols. Example program modules may cause the computer to transform the data string into a generalized message including a second set of symbols by mapping the data string to the generalized message via an inverse of a transformation function. Example program modules may cause the computer to identify, based on a polar code, fixed symbols of the generalized message. Example program modules may cause the computer to generate a compressed data string by extracting the fixed symbols from the generalized message and concatenating the fixed symbols into the compressed data string. As a result, the generalized message may be transformed into the compressed data string.

The foregoing Summary is illustrative only and is not intended to be in any way limiting. In addition to the illustrative aspects, embodiments, and features described above, further aspects, embodiments, and features will become apparent by reference to the Figures and the following Detailed Description.

BRIEF DESCRIPTION OF THE FIGURES

The foregoing and other features of this disclosure will become more fully apparent from the following Detailed Description, accompanying Figures, and appended claims. Understanding that these Figures depict only several embodiments in accordance with the disclosure and are, therefore, not to be considered limiting of its scope, the disclosure will be described with additional specificity and detail with reference to the accompanying Figures, in which:

DETAILED DESCRIPTION

Figure 1:
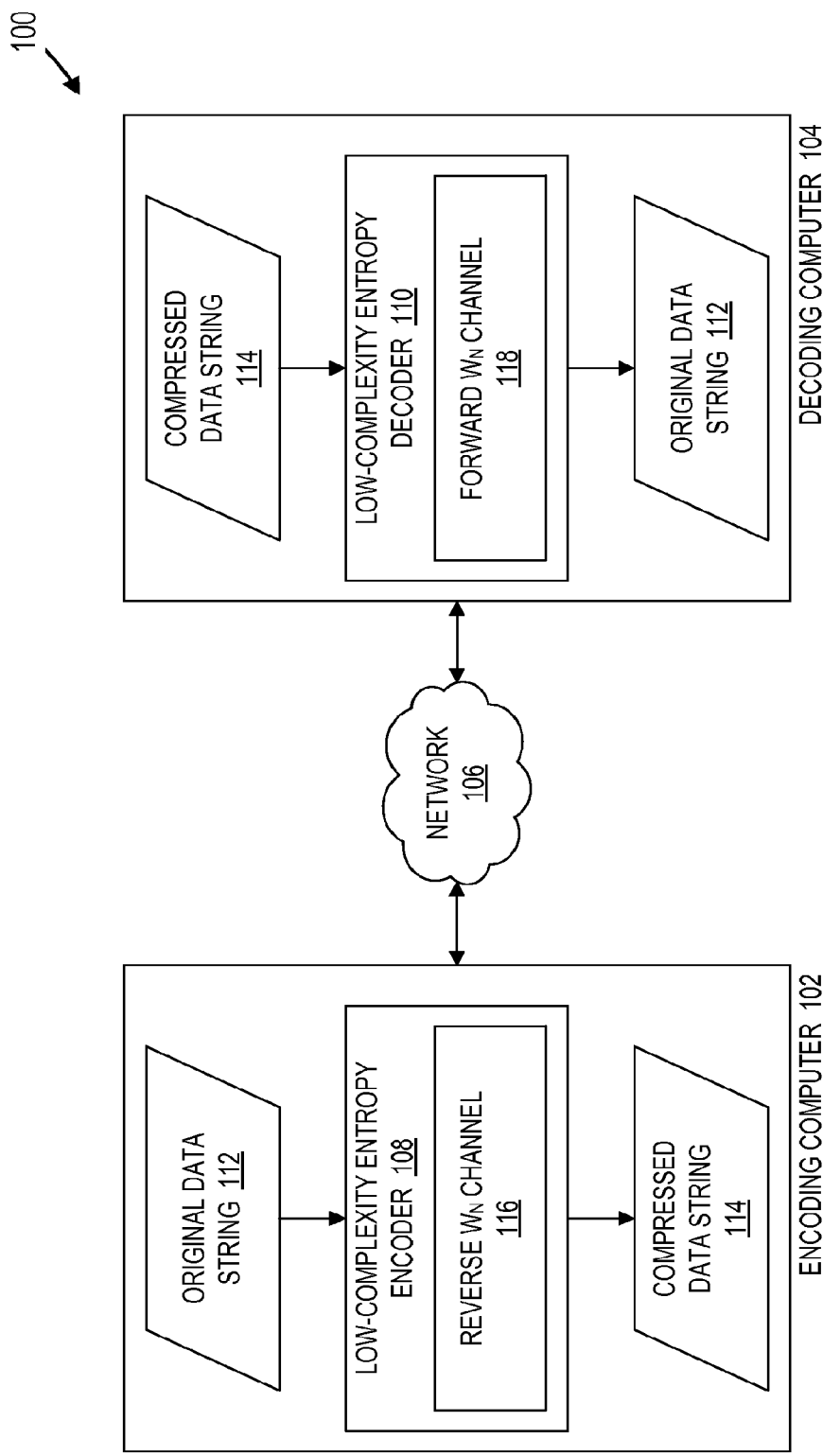
FIG. 1 is a diagram illustrating an example network architecture adapted to provide a low-complexity entropy encoding or decoding based on polar codes.

In the present Detailed Description, reference is made to the accompanying Figures, which form a part hereof. In the Figures, similar symbols typically identify similar components, unless context dictates otherwise. The illustrative embodiments described in the Detailed Description and Figures are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Before proceeding to a detailed description of the low-complexity entropy coders and the low-complexity entropy decoders, a brief introduction to polar codes will now be provided. Polar codes are based on the principle of channel polarization and are the first known coding schemes that achieve the Shannon channel capacity. In some implementations, polar codes may be utilized as a channel code for purposes of error detection or correction in data communications. In particular, polar codes may be utilized to encode a message into a codeword. The codeword may be transmitted over a suitable communications channel, including some channels that might be unreliable or noisy.

In an example polar encoding process performed by an encoder, the encoder may receive a message. The encoder may generate a generalized message by combining the message with some quantity of fixed bits. The fixed bits may refer to bit positions having certain values as defined by a polar code. For example, the fixed bits may be defined as containing zero values in some implementations. The remaining bits of the generalized message may be referred to as free bits. The free bits may be information carrying bits. That is, the free bits may contain the message.

Upon generating the generalized message, the encoder may input the generalized message into a forward $W_N$ channel. The forward $W_N$ channel may generate a codeword based on the generalized message and output the codeword. The variable N in the forward $W_N$ channel may refer to a length of the generalized message (and also the codeword) as defined by the particular implementation of the polar encoder. In other words, the variable N may be equivalent to a sum of the quantity of fixed bits and the quantity of free bits in the generalized message.

The forward $W_N$ channel may be recursively defined for some N greater than two, where $N=2^n$ for some positive integer n. More specifically, the forward $W_N$ channel may divide the message into an odd substring and an even substring. The odd substring may contain the odd numbered bits (e.g., first bit, third bit, fifth bit, etc.), and the even substring may contain the even numbered bits (e.g., second bit, fourth bit, sixth bit, etc.). The forward $W_N$ channel may generate an XOR substring by performing an XOR (exclusive OR) operation on the odd substring and the even substring. The XOR substring may be input into a first forward $W_{N/2}$ channel, and the even substring may be input into a second forward $W_{N/2}$ channel. Each of the forward $W_{N/2}$ channels may repeat the above process performed by the forward $W_N$ channel. The output from the forward $W_{N/2}$ channels be further divided via additional forward $W_{N/\_}$ channels (e.g., $W_{N/4}$, $W_{N/8}$, etc.), as necessary, until $W_2$ has been reached. When $W_2$ has been reached, each forward $W_{N/\_}$ channel from $W_2$ to $W_N$ may concatenate the XOR substring and the even substring output by the respective channel. The final output from the forward $W_N$ channel may be the codeword.

In an example reverse process of the encoding performed by a decoder, decoder may receive the codeword. The decoder may divide the codeword into multiple codeword substrings of two bits. Each codeword substring of two bits may be input into a reverse $W_2$ channel. Generally, a reverse $W_N$ channel may refer to an inverse function of a corresponding forward $W_N$ channel. Each reverse $W_2$ channel may divide the codeword substring into an XOR substring and an even substring. For example, the first bit may be the XOR substring, and the second bit may be the even substring. Each reverse $W_2$ channel may generate an odd substring by performing an XOR operation on the XOR substring and the even substring. The reverse $W_2$ channel may combine the odd substring and the even substring to recover a message substring of two bits.

Message substrings from two adjacent codeword substrings and output by two reverse $W_2$ channels may be input into a respective $W_4$ channel to form larger message substrings of four bits. The above process may continue through additional reverse $W_{N/\_}$ channels, as necessary, until the reverse $W_N$ channel has been reached. The final output from the reverse $W_N$ channel may be the generalized message. The decoder may extract the free bits, as defined by the polar code, from the generalized message and concatenate the free bits to recover the message.

In an illustrative example of a polar encoding process, a generalized message may be defined as having a length of eight bits. The eights bits may include four fixed bits and four free bits. In other words, the encoding process may be capable of encoding a message of length four (i.e., the quantity of free bits). The polar code may define the fixed bits as the first, second, fifth, and sixth bits of the codeword. The fixed bits may be set as zero values. In other implementations, the generalized message may be defined as having other lengths of $2^n$ for some positive integer n. Each length may be divided into some quantity of fixed bits and some quantity of free bits.

The number of fixed bits may be determined by statistics of the to-be-compressed bit string. Because the number of fixed bits may be length of the compressed bit string, an arbitrarily small length of the number of fixed bits may result in a data compression ratio that is arbitrarily high. One skilled in the art will appreciate various design theories for setting the number of fixed bits and their positions. For example, some design theories can be found in the paper by E. Arikan, "Channel polarization: a method for constructing capacity-achieving codes for symmetric binary-input memoryless channels," IEEE Transactions on Information Theory, vol. 55, no. 7, pp. 3051-3073, July 2009. Generally, when a polar code is designed, the rate of the code may first be determined. The rate of the code may refer to the ratio between the number of free bits and the total number of all the bits (i.e., including free and fixed bits). After the rate is determined, various approaches can be utilized to select a fixed bit position (or fixed bit positions) in order to achieve a good performance.

In this example, the encoding process may receive a message 0101. The encoding process may generate a generalized message based on the message 0101. In particular, the message 0101 may define the values of the free bits (i.e., the third, fourth, seventh, and eighth) in the generalized message. The fixed bits (i.e., the first, second, fifth, and sixth bits) may be zero values in this example. Thus, the generalized message may be 00010001 where the underlined portion identifies to the fixed bits and the non-underlined portion identifies the message (i.e., the free bits). The encoding process may input the generalized message into a forward $W_8$ channel because the length of the generalized message is eight. The forward $W_8$ channel may divide the generalized message into an odd substring of 0000 and an even substring of 0101. The forward $W_8$ channel may generate an XOR substring of 0101 by performing an XOR operation on the odd substring of 0000 and the even substring of 0101.

The forward $W_8$ channel may input the XOR substring of 0101 into a first forward $W_4$ channel. The forward $W_8$ channel may also input the even substring of 0101 into a second forward $W_4$ channel. Each forward $W_4$ channel may identify an odd substring of 00 and an even substring of 11. Each forward $W_4$ channel may generate an XOR substring of 11. The first forward $W_4$ channel may input the XOR substring of 11 into a first forward $W_2$ channel. The first forward $W_4$ channel may also input the even substring of 11 into a second forward $W_2$ channel. The second forward $W_4$ channel may input the XOR substring of 11 into a third forward $W_2$ channel. The second forward $W_4$ channel may also input the even substring of 11 into a fourth forward $W_2$ channel.

Each forward $W_2$ channel may identify an odd substring of 1 and an even substring of 1. Each forward $W_2$ channel may determine an XOR substring of 0. Each forward $W_2$ channel may generate a first codeword substring of 01 by concatenating the XOR substring of 0 and the even substring of 1. Each forward $W_4$ channel may generate a second codeword substring of 0101 by concatenating the first codeword substrings of 01 output from the respective forward $W_2$ channels. The forward $W_8$ channel may concatenate the second codeword substrings of 0101 output from the two forward $W_4$ channels to form a codeword of 01010101.

In an illustrative example of a reverse process of encoding, the reverse process may receive the codeword of 01010101. The reverse process may divide the codeword into multiple codeword substrings of 01. The reverse process may input each codeword substring of 01 into one of four reverse $W_2$ channels. Each reverse $W_2$ channel may divide the codeword substring into an XOR substring of 0 and an even substring of 1. Each reverse $W_2$ channel may generate an odd substring of 1 by performing an XOR operation on the XOR substring of 0 and the even substring of 1. Each reverse $W_2$ channel may combine the odd substring of 1 and the even substring of 1 to recover a first message substring of 11.

The reverse process may input a corresponding first pair of first message substrings of 11 into a first reverse $W_4$ channel. The reverse process may also input a corresponding second pair of first message substrings 11 into a second reverse $W_4$ channel. Each pair of first messages substrings may include an XOR substring of 11 and an even substring of 11. Each reverse $W_4$ channel may generate an odd substring of 00 by performing an XOR operation on the XOR substring of 11 and the even substring of 11. Each reverse $W_4$ channel may combine the odd substring of 00 and the even substring of 11 to recover a second message substring of 0101.

The reverse process may input the pair of second message substrings of 0101 into a reverse $W_8$ channel. The pair of second message substrings may include an XOR substring of 0101 and even substring of 0101. The reverse $W_8$ channel may generate an odd substring of 0000 by performing an XOR operation on the XOR substring of 0101 and the odd substring of 0000. The reverse $W_8$ channel may combine the odd substring of 0000 and the even substring of 0101 to recover the generalized message of 00010001, where the underlined portion identifies to the fixed bits and the non-underlined portion identifies the message (i.e., the free bits). The reverse process may extract the free bits and concatenate the free bits to recover the message 0101.

This disclosure is generally drawn, inter alia, to low-complexity entropy coders adapted to compress a data representation by removing redundancy in the data representation. The low-complexity entropy coders may be adapted to compress a data string containing more, and sometimes substantially more, symbols of one value over symbols of other values into a compressed data string having a shorter length. The low-complexity entropy coders may include low-complexity entropy encoders adapted to encode an original data string into a compressed data string. The low-complexity entropy coders may also include low-complexity entropy decoders adapted to recover the original data string from the compressed data string.

The low-complexity entropy coders may facilitate the data compression by utilizing polar codes. The low-complexity entropy coders may have much lower computational complexities than other entropy coders, such as arithmetic coders or Huffman coders. For example, in contrast to the low-complexity entropy coders, these other entropy coders may utilize floating point computations or large mapping tables. As a result, the low-complexity entropy coders may be suitable for applications that might benefit from data compression but also desire or demand lower costs or faster processing speeds afforded by lower computational complexities. Some examples of such applications may include mobile communications, surveillance cameras, or video sensors.

For purposes of simplicity and clarity, various examples described herein may refer to binary cases where a binary polar code is utilized and a to-be-compressed string is binary. It should be appreciated that various technologies described herein can be utilized for both binary and non-binary cases. In other words, various technologies described herein may be utilized in non-binary cases where a non-binary polar code is utilized and the to-be-compressed string is non-binary. For example, the term "symbol" used herein may generally refer to a binary value or a non-binary value.

In an illustrative compression implementation, the low-complexity entropy encoders may receive as input an original data string. The low-complexity entropy encoders may map the original data string into a generalized message by utilizing a reverse $W_N$ channel where N represents a length of the original data string. That is, the original data string may be considered as a codeword for purposes of input into the reverse $W_N$ channel. The generalized message may include multiple fixed bits and multiple free bits, the positions of which may be defined by a polar code. The low-complexity entropy encoders may extract the fixed symbols from the generalized message and concatenate the fixed symbols into a compressed data string. The compressed data string may be a compressed representation of the original data string. In particular, the compressed data string may have a much shorter length compared to the original data string. An administrator or additional module may test the low-complexity entropy encoders by immediately verifying that the outputted compressed data string (e.g., prior to providing the outputted compressed data string to another user or device), when decompressed, matches the inputted original data string.

In an illustrative decompression implementation, the low-complexity entropy decoders may receive as input the compressed data string. The low-complexity entropy decoders may assume that an all-zero data string is a received codeword as in an error correction coding case. The low-complexity entropy decoders may execute a polar decoding process adapted to recover the free symbols in the corresponding generalized message. The low-complexity entropy decoders may generate a new generalized message by inserting the recovered values into the positions corresponding to the free bits as defined by the polar code and inserting the values of the compressed binary string into the remaining positions corresponding to the fixed bits. The low-complexity entropy decoders may map the generalized message into the original binary string by utilizing a forward $W_N$ channel that outputs the original binary string. An administrator or additional module may test the low-complexity entropy decoders by immediately verifying that the outputted data string (e.g., prior to providing the outputted data string to another user or device), when compressed, matches the inputted compressed data string. Further, when testing the low-complexity entropy coders or the low-complexity entropy decoders, an administrator or additional module may verify that the result output from the low-complexity entropy decoders matches the original input into the low-complexity entropy encoders.

It should be appreciated that the reverse process of encoding described above may differ from a polar decoding process for polar codes. For example, an example of a polar decoding process for polar codes may be a successive-cancellation decoding. Given an input binary string and fixed bits, the successive-cancellation decoding may attempt to find a certain binary string that is not far from the input binary string and compatible with the fixed bits. Additional information regarding the successive-cancellation decoding can be found in the paper by E. Arikan, "Channel polarization: a method for constructing capacity-achieving codes for symmetric binary-input memoryless channels," IEEE Transactions on Information Theory, vol. 55, no. 7, pp. 3051-3073, July 2009.

FIG. 1 is a diagram illustrating an example network architecture 100 adapted to provide a low-complexity entropy encoding or decoding based on polar codes, arranged in accordance with at least some embodiments presented herein. The network architecture 100 may include an encoding computer 102 coupled to a decoding computer 104 via a network 106. The encoding computer 102 may include a low-complexity entropy encoder 108. The decoding computer 104 may include a low-complexity entropy decoder 110. Although the low-complexity entropy encoder 108 and the low-complexity entropy decoder 110 are illustrated as separate modules in FIG. 1, it should be appreciated that that the low-complexity entropy encoder 108 and the low-complexity entropy decoder 110 may also be combined in a single module.

The low-complexity entropy encoder 108 may be configured to receive as input an original data string 112. The original data string 112 may include multiple data symbols. In some embodiments, each data symbol may be a bit. The low-complexity entropy encoder 108 may be configured to generate a compressed data string 114 based on the original data string 112 by utilizing polar codes. According to various embodiments, the low-complexity entropy encoder 108 may utilize a reverse $W_N$ channel 116 in order to transform the original data string 112 into the compressed data string 114. The length (i.e., the number of symbols) of the compressed data string 114 may be less, and in some cases substantially less, than the length of the original data string 112. For example, while the length of the original data string 112 may be equivalent to the length of a codeword as defined by a polar code, the length of the compressed data string 114 may be equivalent to the number of fixed bits of a generalized message as defined by a polar code. The low-complexity entropy encoder 108 may be configured to output the compressed data string 114. An administrator or additional module may test the low-complexity entropy encoder 108 by verifying that the outputted compressed data string 114, when decompressed, matches the inputted original data string 112.

The encoding computer 102 may be configured to transmit the compressed data string 114 to the decoding computer 104 via the network 106. The low-complexity entropy decoder 110 may be configured to receive as input the compressed data string 114. The low-complexity entropy decoder 110 may be configured to recover the original data string 112 based on the compressed data string 114 by utilizing polar codes. According to various embodiments, the low-complexity entropy decoder 110 may utilize a forward $W_N$ channel 118 in order to transform the compressed data string 114 into the original data string 112. The low-complexity entropy decoder 110 may be configured to output the original data string 112. An administrator or additional module may test the low-complexity entropy decoder 110 by verifying that the outputted original data string 112, when compressed, matches the inputted compressed data string 114. When testing the low-complexity entropy encoder 108 or the low-complexity entropy decoder 110, an administrator or additional module may verify that the original data string 112 output from the low-complexity entropy decoder 110 matches the original data string 112 originally input into the low-complexity entropy encoder 108.

Figure 2:
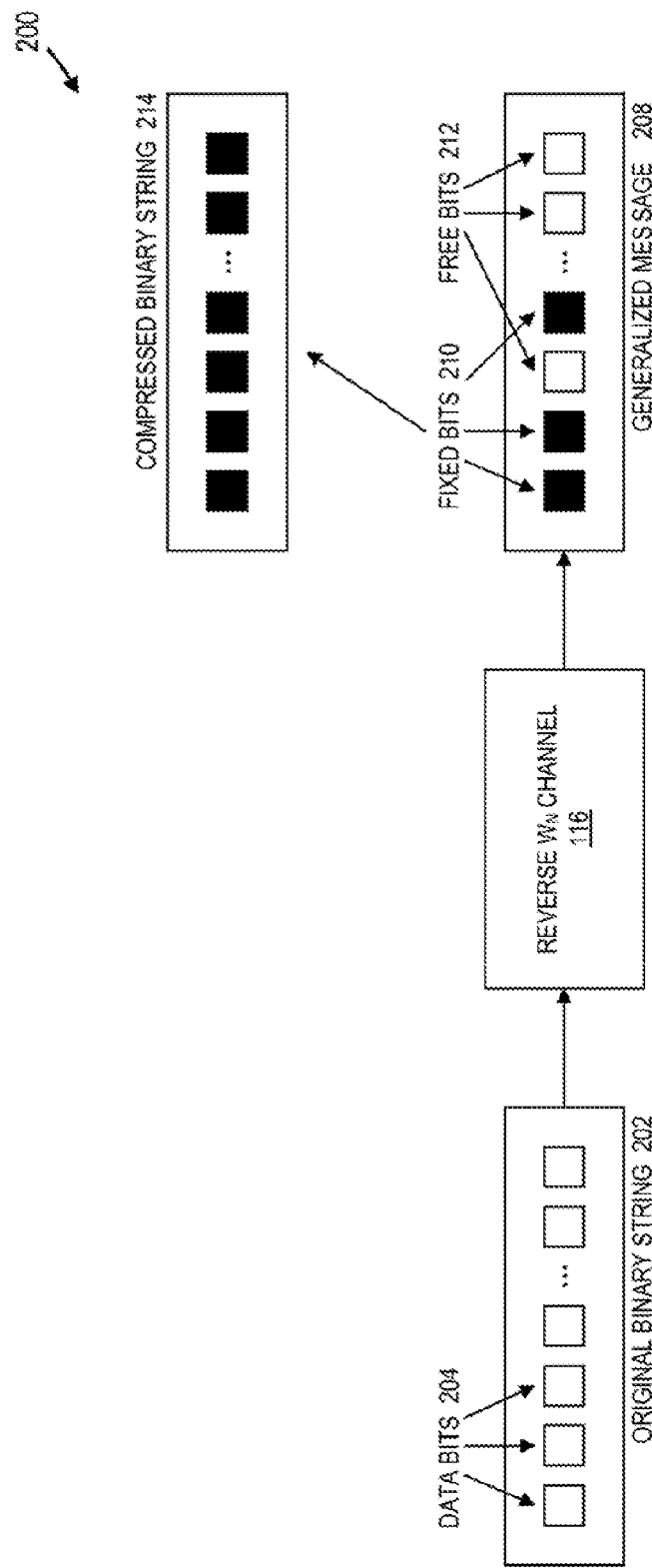
FIG. 2 is a diagram illustrating an example process flow of a data compression process using polar codes.

FIG. 2 is a diagram illustrating an example process flow 200 of a data compression process using polar codes, arranged in accordance with at least some embodiments presented herein. The low-complexity entropy encoder 108 may be configured to receive as input an original binary string 202 which includes multiple data bits 204. The original binary string 202 may be an example of the original data string 112. The original binary string 202 may be a sparse string that contains more zero values (than one values) or more one values (than zero values). The low-complexity entropy encoder 108 may be configured to utilize the observation that the original binary string is a sparse string in order to compress the original binary string 202.

Upon receiving the original binary string 202, the low-complexity entropy encoder 108 may be configured to input the original binary string 202 into the reverse $W_N$ channel 116. The variable N refers to the length of the original binary string 202. The reverse $W_N$ channel 116 may be configured to perform an inverse of a transformation function performed by the forward $W_N$ channel 118. The reverse $W_N$ channel 116 may be configured to generate a generalized message 208 based on the original binary string 202. The generalized message 208 may include a certain quantity of fixed bits 210 and a certain quantity of free bits 212 as defined by a polar code implemented by the low-complexity entropy encoder 108.

The low-complexity entropy encoder 108 may be configured to extract the fixed bits 210 from the generalized message 208 and concatenate the fixed bits 210 to form a compressed binary string 214. The compressed binary string 214 may be an example of the compressed data string 114. The low-complexity entropy encoder may be configured to output the compressed binary string 214 as a compressed representation of the original binary string 202. The operation of the low-complexity entropy encoder 108 and the reverse $W_N$ channel 116 is described in greater detail below with reference to FIG. 4.

Figure 3:
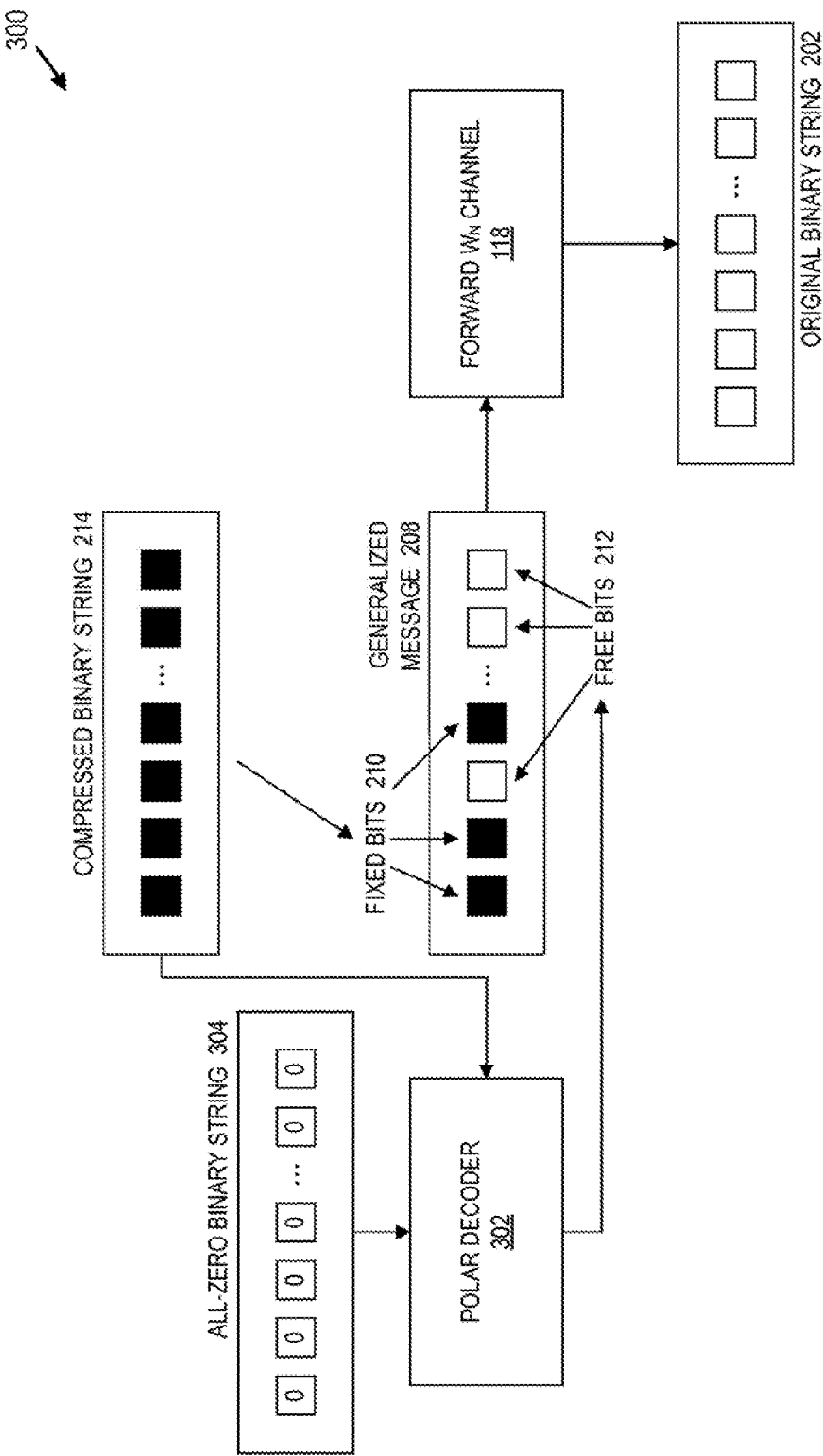
FIG. 3 is a diagram illustrating an example process flow of a data decompression process using polar codes.

FIG. 3 is a diagram illustrating an example process flow 300 of a data decompression process using polar codes, arranged in accordance with at least some embodiments presented herein. The low-complexity entropy decoder 110 may be configured to receive the compressed binary string 214. The low-complexity entropy decoder 110 may be configured to recover the generalized message 208 based on the compressed binary string 214. As previously described, the compressed binary string 214 may identify the fixed bits 210 of the generalized message 208.

In order to identify the values of the free bits 212, the low-complexity entropy decoder 110 may utilize a polar decoder 302. As previously described, a polar decoder, such as the polar decoder 302, may receive a corrupted codeword and generate a generalized message based on the corrupted codeword. The polar decoder 302 may then extract the free bits from the generalized message. In the process flow 300, the polar decoder 302 may be configured to receive an all-zero binary string 304 as a corrupted codeword; that is, the all-zero binary string may be resulting from flipping several bits of one codeword from one to zero. Thus, the polar decoder 302 may be configured to extract the free bits 212 from the generalized message corresponding to the estimated codeword based on the corrupted codeword, e.g., the all-zero binary string 304.

The low-complexity entropy decoder 110 may be configured to recover the generalized message 208 by combining the fixed bits 210 from the compressed binary string 214 and the free bits 212 extracted from the generalized message recovered based on the all-zero binary string 304. The low-complexity entropy decoder 110 may be configured to input the generalized message containing the compressed binary string 214 into the forward $W_N$ channel 118. The forward $W_N$ channel 118 may be configured to perform the transformation function previously mentioned with reference to FIG. 2. The forward $W_N$ channel 118 may be configured to recover the original binary string 202 based on the generalized message 208. The operation of the low-complexity entropy decoder 110 and the forward $W_N$ channel 118 is described in greater detail below with reference to FIG. 5.

While examples described above refer to sparse strings with mostly zero bit values, various technologies described herein can also handle sparse strings with most one bit values (as well as other symbol values). In particular, a sparse string with most one bit values can be mapped to a sparse string with mostly zero bit values. That is, any one bit value can be mapped to a zero bit value, and any zero bit value can be mapped to a one bit value in the previous examples. The various technologies described herein can then be applied to the mapped sparse string having mostly zero values.

With reference to FIGS. 2 and 3, an illustrative example of an entropy encoding process and an entropy decoding process will be described. In this example, the length of the generalized message 208 may be eight bits, of which five bits may be the fixed bits 210 and three bits may be the free bits 212. The fixed bits 210 may correspond to the first, second, third, fifth, and sixth bits. Thus, the free bits 212 may correspond to the fourth, seventh, and eighth bits.

In this illustrative example, the original binary string 202 may be 00000010. The reverse $W_N$ channel 116 may be configured to receive as input the original binary string 202 of 00000010 and output the generalized message 208 of 11110000. In the entropy encoding process, the fixed bits 210 may be extracted and concatenated to form the compressed binary string 214 of 11100. In the entropy decoding process, the polar decoder 302 may receive the compressed binary string 214 of 11100. The compressed binary string 214 of 11100 may correspond to the fixed bits 210. Thus, the polar decoder 302 may be configured to recover the free bits 212.

In order to recover the free bits 212, the polar decoder 302 may be configured to consider one or more possible combinations of the free bits 212. In this example, since the free bits 212 correspond to three bits in the generalized message 208, there are $2^3=8$ possible configurations of the free bits 212. The table below details the possible configurations of the free bits 212, the corresponding generalized message 208, and the resulting codeword when the generalized message 208 is input into the forward $W_N$ channel 118. The resulting codeword may represent a possible solution for recovering the original binary string 202.

| Number | Free Bit configuration | Generalized Message | Codeword |
|---|---|---|---|
| 1 | 000 | 11100000 | 10101000 |
| 2 | 001 | 11100001 | 01010111 |
| 3 | 010 | 11100010 | 01011000 |
| 4 | 011 | 11100011 | 10100111 |
| 5 | 100 | 11110000 | 00000010 |
| 6 | 101 | 11110001 | 11111101 |
| 7 | 110 | 11110010 | 11110010 |
| 8 | 111 | 11110011 | 00001101 |

In this example, the use of the entropy encoding process can be limited to sparse strings containing mostly zero values. Using this knowledge, the polar decoder 302 may be configured to identify and select the free bit configuration that results in the codeword having the most zero values. According to the table above, the codeword 00000010 contains the most zero values. Thus, the polar decoder 302 may be configured to select the corresponding fifth free bit configuration of 100 as the free bits 212 and output the codeword 00000010, which correctly matches the original binary string 202.

If a polar code is well-designed and has a reasonably long length, then the above approach of guessing the free bits 212 can be correct with relatively high probabilities. That is, the above approach can result in very small probabilities of decoding errors. It should be appreciated that computing the table above for every possible free bit configuration may be computationally complex or difficult in some implementations. As an alternative, the successive-cancellation decoding, as previously discussed, may be utilized to recover the free bits according to the above approach with low computational complexity.

Figure 4:
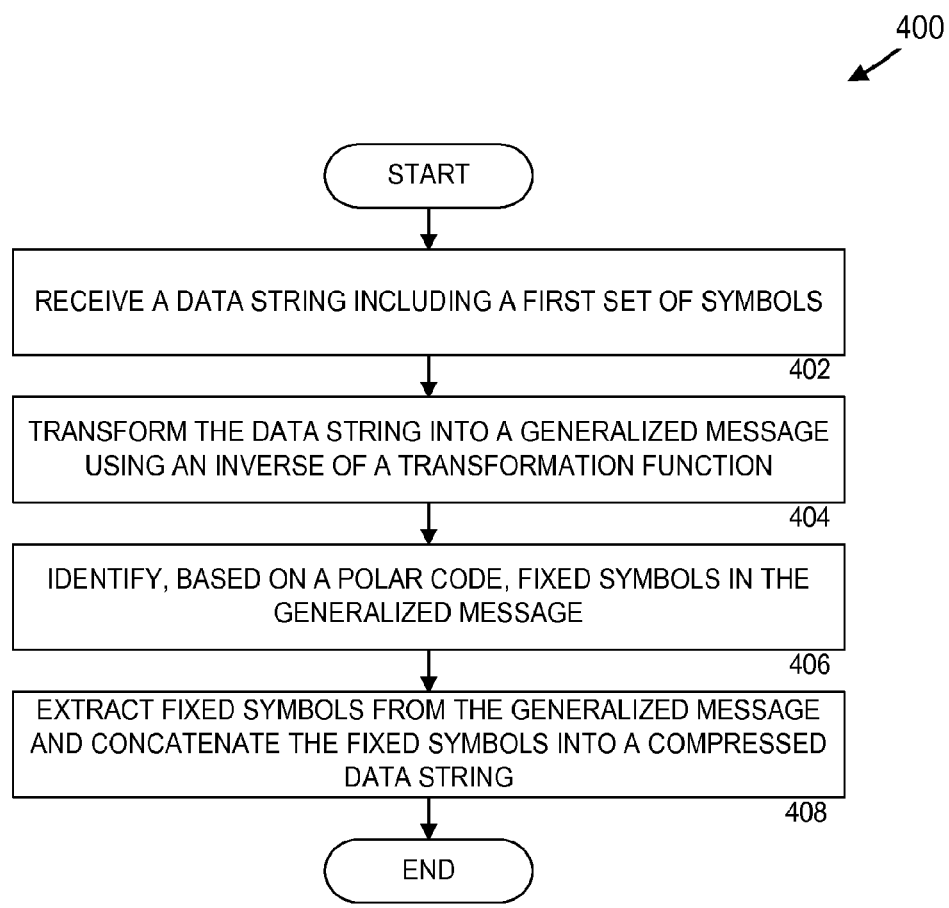
FIG. 4 is a flow diagram illustrating an example process adapted to perform data compression using polar codes.

FIG. 4 is a flow diagram illustrating an example process 400 adapted to perform data compression using polar codes, arranged in accordance with at least some embodiments presented herein. The process 400 may be performed by the low-complexity entropy encoder 108 in some implementations. The process 400 may include various operations, functions, or actions as illustrated by one or more blocks 402-408.

The process 400 may begin at block 402 (Receive a Data String Including a First Set of Symbols), where the low-complexity entropy encoder 108 may be configured to receive a data string, such as the original data string 112 or the original binary string 202. The data string may include a first set of symbols. In some embodiments, the symbols may refer to bits. For example, the data string may be a sparse binary string that contains more zero values or more one values. Block 402 may be followed by block 404.

At block 404 (Transform the Data String into a Generalized Message Using an Inverse of a Transformation Function), the low-complexity entropy encoder 108 may be configured to input the data string into a reverse $W_N$ channel, such as the reverse $W_N$ channel 116, where the variable N refers to the length of the data string. The variable N may have a value of $2^n$ where n is a positive integer. The reverse $W_N$ channel may be configured to perform an inverse of a transformation function that transforms the data string into a generalized message. The reverse $W_N$ channel may be recursively defined such that the reverse $W_N$ channel includes reverse $W_{N/\_}$ channels down to reverse $W_2$ channels.

In an example implementation of the reverse $W_N$ channel, the reverse $W_N$ channel may be configured to receive a binary string. The reverse $W_N$ channel may be configured to divide the binary string into multiple substrings of two bits. The reverse $W_N$ channel may be configured to input each substring of two bits into a corresponding reverse $W_2$ channel. Each reverse $W_2$ channel may be configured to divide the substring of two bits into an XOR substring and an even substring. Each reverse $W_2$ channel may be configured to generate an odd substring by performing an XOR operation on the XOR substring and the even substring. For example, the first bit may be the XOR substring, and the second bit may be the even substring. The reverse $W_2$ channel may be configured to combine the odd substring and the even substring to generate a message substring. The odd substring may form the odd numbered bit(s) of the message substring, and the even substring may form the even numbered bit(s) of the message substring.

Message substrings from adjacent substrings and output by two reverse $W_2$ channels may be input into a respective reverse $W_4$ channel to form larger message substrings of four bits. The above process may continue through additional reverse $W_{N/\_}$ channels, as necessary, until the reverse $W_N$ channel has been reached. The final output from the reverse $W_N$ channel may be the generalized message.

In an illustrative example of the above implementation of the reverse $W_N$ channel, the reverse $W_N$ channel may be configured to receive a binary string of 01000000. It can be noted that the binary string of 01000000 is a sparse string that contains more zero values than one values. The reverse $W_N$ channel may be configured to divide the binary string into four substrings: 01, 00, 00, and 00. The reverse $W_N$ channel may be configured to input the first substring of 01 into a first a reverse $W_2$ channel, the second substring of 00 into a second reverse $W_2$ channel, the third substring of 00 into a third reverse $W_2$ channel, and the fourth substring of 00 into a fourth reverse $W_2$ channel.

The first reverse $W_2$ channel may be configured to divide the first substring 01 into an XOR substring of 0 and an even substring of 1. The first reverse $W_2$ channel may be configured to generate an odd substring of 1 by performing an XOR operation on 0 and 1. The first reverse $W_2$ channel may be configured to combine the odd substring of 1 and the even substring of 1 to form a first two-bit message substring of 11. Each of the second, third, and fourth reverse $W_2$ channels may be configured to divide its respective substring of 00 into an XOR substring of 0 and an even substring of 0. Each of the second, third, and fourth reverse $W_2$ channels may be configured to generate an odd substring of 0 by performing an XOR operation on 0 and 0. Each of the second, third, and fourth reverse $W_2$ channels may be configured to combine the odd substring of 0 and the even substring of 0 to form respective two-bit message substrings of 00.

The first two-bit message substring of 11 from the first reverse $W_2$ channel and the second two-bit message substring of 00 from the second reverse $W_2$ channel may be input into a first reverse $W_4$ channel. The first reverse $W_4$ channel may consider the first two-bit message substring of 11 as an XOR substring and the second two-bit message substring of 00 as an even substring. The third two-bit message substring of 00 from the third reverse $W_2$ channel and the fourth two-bit message substring of 00 from the fourth reverse $W_2$ channel may be input into a second reverse $W_4$ channel. The second reverse $W_4$ channel may consider the third two-bit message substring of 00 as an XOR substring and the fourth two-bit message substring of 00 as an even substring.

The first reverse $W_4$ channel may be configured to generate an odd substring of 11 by performing an XOR operation on 11 and 00. The first reverse $W_4$ channel may be configured to combine the odd substring of 11 and the even substring of 00 to form a first four-bit message substring of 1010. The second reverse $W_4$ channel may be configured to generate an odd substring of 00 by performing an XOR operation on 00 and 00. The second reverse $W_4$ channel may be configured to combine the odd substring of 00 and the even substring of 00 to form a second four-bit message substring of 0000.

The first four-bit message substring of 1010 and the second four-bit message substring of 0000 may be input into a reverse $W_8$ channel. The reverse $W_8$ channel may consider the first four-bit message substring of 1010 as an XOR substring and the second four-bit message substring of 0000 as an even substring. The reverse $W_8$ channel may be configured to generate an odd substring of 1010 by performing an XOR operation on 1010 and 0000. The reverse $W_8$ channel may be configured to combine the odd substring of 1010 and the even substring of 0000 to from a generalized message of 10001000. Block 404 may be followed by block 406.

At block 406 (Identify, Based on a Polar Code, Fixed Symbols in the Generalized message), the low-complexity entropy encoder 108 may be configured to identify the fixed symbols in the generalized message according to a particular polar code utilized by the low-complexity entropy encoder 108. According to various embodiments, the low-complexity entropy encoder 108 may be configured to identify all fixed symbols in the generalized message or a subset of fixed symbols in the generalized message. The polar code may identify the location of fixed symbols and free symbols in the generalized message. In the previous illustrative example, the polar code may identify the fixed bits as first, second, fourth, and fifth bits of the generalized message of 10001000. Block 406 may be followed by block 408.

At block 408 (Extract Fixed Symbols from the Generalized Message and Concatenate the Fixed Symbols into a Compressed Data String), the low-complexity entropy encoder 108 may be configured to extract the fixed symbols from the generalized message and concatenate the fixed symbols into a compressed data string. Continuing the previous illustrative example, the polar code may identify the fixed bits as first, second, fifth, and sixth bits of the generalized message of 10001000. Thus, the low-complexity entropy encoder 108 may be configured to extract the bits 1, 0, 1, 0 from the generalized message. The low-complexity entropy encoder 108 may be configured to concatenate the bits 1, 0, 1, 0 to form a compressed binary string of 1010. The compressed binary string of 1010 may be a compressed representation of the binary string 01000000. In particular, the length (i.e., four bits) of the compressed binary string may be much smaller than the length (i.e., eight bits) of the binary string. After block 408, the process 400 either repeat (e.g., periodically, continuously, or on demand as needed) or terminate.

Figure 5:
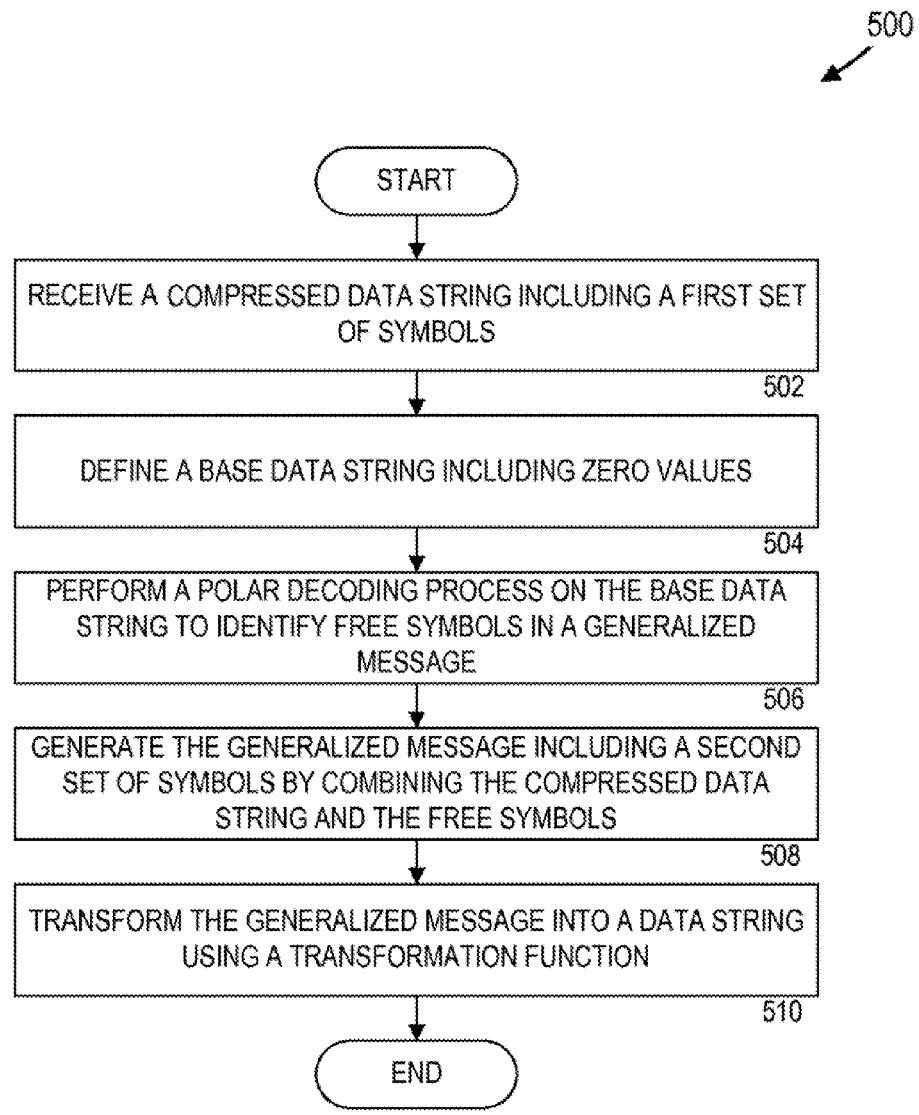
FIG. 5 is a flow diagram illustrating an example process adapted to perform data decompression using polar codes.

FIG. 5 is a flow diagram illustrating an example process 500 adapted to perform data decompression using polar codes, arranged in accordance with at least some embodiments presented herein. The process 500 may be performed by the low-complexity entropy decoder 110 in some implementations. The process 500 may include various operations, functions, or actions as illustrated by one or more blocks 502-508.

The process 500 may begin at block 502 (Receive a Compressed Data String Including a First Set of Symbols), where the low-complexity entropy decoder 110 may be configured to receive a compressed data string, such as the compressed data string 114 or the compressed binary string 214. The data string may include a first set of symbols. In some embodiments, the symbols may refer to bits. For example, the compressed data string may be a compressed binary sting. Block 502 may be followed by block 504.

At block 504 (Define a Base Data String Including Zero values), the low-complexity entropy decoder 110 may be configured to define a base data string including zero values. For example, the base data string may be an all-zero binary string. Block 504 may be followed by block 506.

At block 506 (Perform a Polar Decoding Process on the Base Data String to Identify Free Symbols in a Generalized Message), the low-complexity entropy decoder 110 may be configured to perform a polar decoding on the base data string to identify free symbols in a generalized message. A polar decoding process may consider the base data string as a corrupted codeword and transform the base data string of zero values into a generalized message. The polar decoding process may extract the free symbols from the generalized message according to a particular polar code utilized by the polar decoding process. For example, the polar decoding process may extract the appropriate bits from the fixed bit positions in a binary generalized message. Block 506 may be followed by block 508.

At block 508 (Generate the Generalized Message Including a Second Set of Symbols by Combining the Compressed Data String and the Free Symbols), the low-complexity entropy decoder 110 may be configured to combine the compressed data string and the identified free symbols to form the generalized message. The low-complexity entropy decoder 110 may be configured to consider the compressed data string as the fixed symbols of the generalized message. The polar code utilized may be the low-complexity entropy decoder 110 may define the positions of the free symbols and the fixed symbols in a given generalized message. As such, the low-complexity entropy decoder 110 may be configured to generate the generalized message by arranging the compressed data string in the pre-defined positions of the fixed symbols in the generalized message and the identified free symbols in the pre-defined positions of the of the free symbols in the generalized message.

In an illustrative example, the compressed data string may be a compressed binary string of 11100. The polar decoder may output a binary string 100, which includes the free bits extracted from performing a polar decoding on an eight-bit all-zero binary string. The low-complexity entropy decoder 110 may utilize a polar code that defines the fixed bits as the first, second, third, fifth, and sixth bits of a given generalized message. Here, the low-complexity entropy decoder 110 may be configured to generate a generalized message of 11110000 by arranging the compressed binary string in the fixed bit positions (underlined) of the generalized message and arranging the free bits in the free bit positions (not underlined) of the generalized message. Block 508 may be followed by block 510.

At block 510 (Transform the Generalized Message into a Data String Using a Transformation Function), the low-complexity entropy decoder 110 may be configured to input the generalized message into a forward $W_N$ channel, such as the forward $W_N$ channel 118, where the variable N refers to the length of the data string. The variable N may have a value of $2^n$ where n is a positive integer. The forward $W_N$ channel maybe configured to perform a transformation function that transforms the generalized message into the data string. The forward $W_N$ channel may be recursively defined such that the forward $W_N$ channel includes forward $W_{N/\_}$ channels down to forward $W_2$ channels.

In an example implementation of the forward $W_N$ channel, the forward $W_N$ channel may be configured to receive the generalized message. The forward $W_N$ channel may be configured to divide the generalized message into an odd substring and an even substring. The odd substring may contain the odd numbered symbols (e.g., first bit, third bit, fifth bit, etc.), and the even substring may contain the even numbered symbols (e.g., second bit, fourth bit, sixth bit, etc.). The forward $W_N$ channel may generate an XOR substring by performing an XOR operation on the odd substring and the even substring. The XOR substring may be input into a first forward $W_{N/2}$ channel, and the even substring may be input into a second forward $W_{N/2}$ channel. The substrings may be further divided via additional forward $W_{N/\_}$ channels, as necessary, until $W_2$ has been reached. Each forward $W_{N/\_}$ channel from $W_2$ to $W_N$ may concatenate the XOR substring and the even substring output by the respective channel. The final output from the forward $W_N$ channel may be the data string.

In an illustrative example of the above implementation of the forward $W_N$ channel, a forward $W_8$ channel may be configured to receive a generalized message of 10001000. The forward $W_8$ channel may be configured to divide the generalized message into an odd substring of 1010 and even substring of 0000. The forward $W_8$ channel may be configured to perform an XOR operation on the odd substring of 1010 and the even substring of 0000 to generate an XOR substring of 1010. The forward $W_8$ channel may be configured to input the XOR substring of 1010 into first forward $W_4$ channel and the even substring of 0000 into a second forward $W_4$ channel.

The first forward $W_4$ channel may be configured to divide the received substring of 1010 into an odd substring of 11 and an even substring of 00. The first forward $W_4$ channel may be configured to perform an XOR operation on the odd substring of 11 and the even substring of 00 to generate an XOR substring of 11. The first forward $W_4$ channel may be configured to input the XOR substring of 11 into a first forward $W_2$ channel and the even substring of 00 into a second forward $W_2$ channel.

The second forward $W_4$ channel may be configured to divide the received substring of 0000 into an odd substring of 00 and an even substring of 00. The second forward $W_4$ channel may be configured to perform an XOR operation on the odd substring of 00 and the even substring of 00 to generate an XOR substring of 00. The second forward $W_4$ channel may be configured to input the XOR substring of 00 into a third forward $W_2$ channel and the even substring of 00 into a fourth forward $W_2$ channel.

The first forward $W_2$ channel may be configured to divide the received substring of 11 into an odd substring of 1 and an even substring of 1. The first forward $W_2$ channel may be configured to perform an XOR operation on the odd substring of 1 and the even substring of 1 to generate an XOR substring of 0. Each of the second, third, and fourth forward $W_2$ channels may be configured to divide the received substring of 00 into an odd substring of 0 and an even substring of 0. Each of the second, third, and fourth forward $W_2$ channels maybe configured to perform an XOR operation on the odd substring of 0 and the even substring of 0 to generate an XOR substring of 0.

The first forward $W_2$ channel may be configured to concatenate the XOR substring of 0 and the even substring of 1 to form a first data substring of 01. Each of the second, third, and fourth forward $W_2$ channels may be configured to concatenate the XOR substring of 0 and the even substring to form respective data substrings of 00. The first forward $W_4$ channel may be configured to concatenate the first data substring of 01 and the second data substring of 00 to form a fifth data substring of 0100. The second forward $W_4$ channel may be configured to concatenate the third data substring of 00 and the fourth data substring of 00 to form the sixth data substring of 0000. The forward $W_8$ channel may be configured to concatenate the fifth data substring of 0100 and the sixth data substring 0000 to form the data string of 0100000. It can be verified that the data string output by the low-complexity entropy decoder 110 matches the data string input into the low-complexity entropy encoder 108 as previously described with reference to FIG. 4. After block 500, the process 500 either repeat (e.g., periodically, continuously, or on demand as needed) or terminate.

Figure 6:
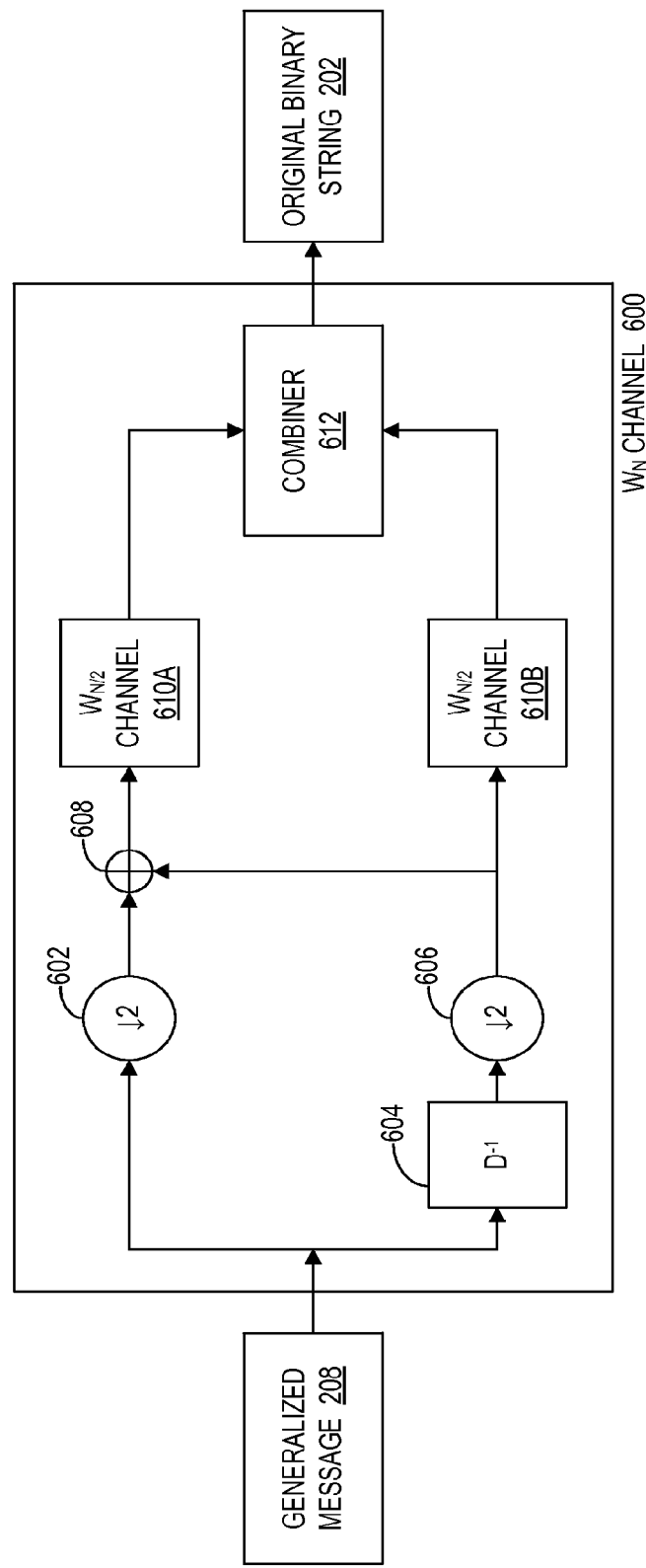
FIG. 6 is a functional block diagram illustrating an example implementation of a forward $W_N$ channel.

FIG. 6 is a functional block diagram illustrating an example implementation of a forward $W_N$ channel 600, arranged in accordance with at least some embodiments presented herein. The forward $W_N$ channel 600 may be configured to transform the generalized message 208 into the original binary string 202 where N>2. The forward $W_N$ channel 600 may include a first downsampler 602, a delay element 604, a second downsampler 606, an XOR module 608, a first $W_{N/2}$ channel 610A, a second $W_{N/2}$ channel 610B, and a combiner 612.

The generalized message 208 may be passed through the first downsampler 602. The first downsampler 602 may be configured to identify the odd numbered symbols in the generalized message 208. For example, a generalized message of $[U_1, U_2, U_3, \ldots U_N]$ may be mapped to an odd substring of $[U_1, U_3, U_5, \ldots, U_{N-1}]$ via the first downsampler 602. The generalized message 208 may also be passed through the delay element 604 and the second downsampler 606. The delay element 604 may be configured to remove the first symbol in the generalized message. For example, a generalized message of $[U_1, U_2, U_3, \ldots U_N]$ may be mapped to an intermediate substring of $[U_2, U_3, U_4, \ldots U_N]$ via the delay element 604. By removing the first symbol in the generalized message, the second downsampler 606 may be configured to identify the even numbered symbols in the generalized message 208. For example, the intermediate substring of $[U_2, U_3, U_4, \ldots U_N]$ may be mapped to an even substring of $[U_2, U_4, U_6, \ldots, U_N]$ via the second downsampler 606.

The XOR module 608 may perform an XOR operation on the odd substring and the even substring to form an XOR substring. The XOR substring may be input into the first $W_{N/2}$ channel 610A. The even substring may be input into the second $W_{N/2}$ channel 610B. The first $W_{N/2}$ channel 610A and the second $W_{N/2}$ channel 610B may be recursively defined such that the first $W_{N/2}$ channel 610A and the second $W_{N/2}$ channel 610B may include additional $W_{N/}$ channels, as necessary, down to $W_2$ channels. Each of the $W_N$ channels from $W_2$ to $W_N$ may include a combiner adapted to concatenate the resulting XOR substring and the resulting even substring. The combiner 614 may be configured to concatenate the results from the first $W_{N/2}$ channel 610A and the second $W_{N/2}$ channel 610B to form the original binary string 202. It should be appreciated that a reverse $W_N$ channel may be configured as an inverse of the forward $W_N$ channel 600, according to some implementations.

Figure 7:
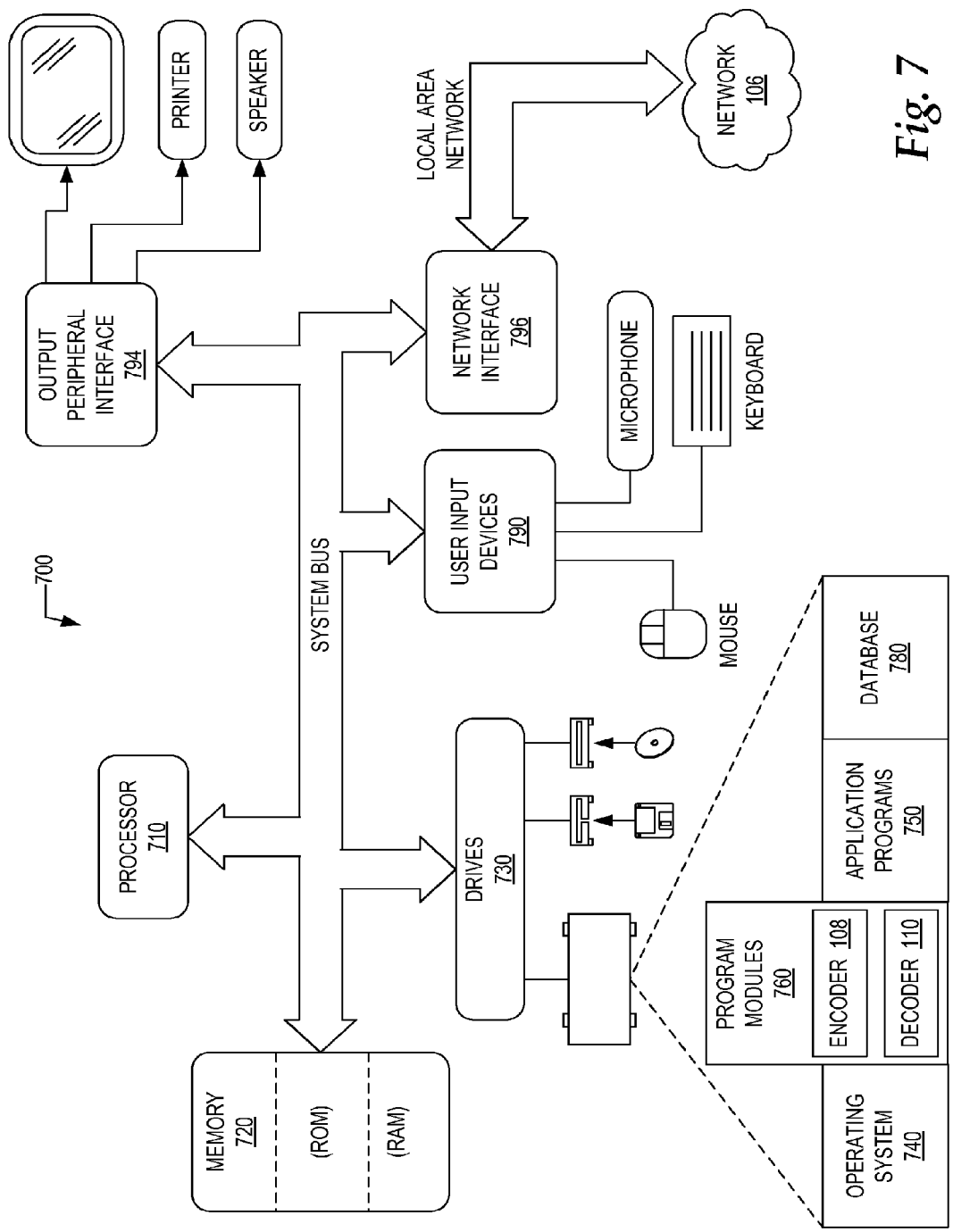
FIG. 7 is a block diagram illustrating a computer hardware architecture for an example computing system.

FIG. 7 is a block diagram illustrating a computer hardware architecture for an example computing system, arranged in accordance with at least some embodiments presented herein. FIG. 7 includes a computer 700, including a processor 710, memory 720, and one or more drives 730. The computer 700 may be implemented as a conventional computer system, an embedded control computer, a laptop, or a server computer, a mobile device, a set-top box, a kiosk, a vehicular information system, a mobile telephone, a customized machine, or other hardware platform.

The drives 730 and their associated computer storage media, provide storage of computer readable instructions, data structures, program modules and other data for the computer 700. The drives 730 can include an operating system 740, application programs 750, program modules 760, and a database 780. Some examples of the program modules 760 may include the low-complexity entropy encoder 108 and the low-complexity entropy decoder 110. The computer 700 further includes user input devices 790 through which a user may enter commands and data. Input devices can include an electronic digitizer, a microphone, a keyboard and pointing device, commonly referred to as a mouse, trackball or touch pad. Other input devices may include a joystick, game pad, satellite dish, scanner, or the like.

These and other input devices can be coupled to the processor 710 through a user input interface that is coupled to a system bus, but may be coupled by other interface and bus structures, such as a parallel port, game port or a universal serial bus ("USB"). Computers such as the computer 700 may also include other peripheral output devices such as speakers, which may be coupled through an output peripheral interface 794 or the like.

The computer 700 may operate in a networked environment using logical connections to one or more computers, such as a remote computer coupled to a network interface 796. The remote computer may be a personal computer, a server, a router, a network PC, a peer device or other common network node, and can include many or all of the elements described above relative to the computer 700. Networking environments are commonplace in offices, enterprise-wide area networks ("WAN"), local area networks ("LAN"), intranets, and the Internet.

When used in a LAN or WLAN networking environment, the computer 700 may be coupled to the LAN through the network interface 796 or an adapter. When used in a WAN networking environment, the computer 700 typically includes a modem or other means for establishing communications over the WAN, such as the Internet or the network 106. The WAN may include the Internet, the illustrated network 106, various other networks, or any combination thereof. It will be appreciated that other mechanisms of establishing a communications link, ring, mesh, bus, cloud, or network between the computers may be used.

According to some embodiments, the computer 700 may be coupled to a networking environment. The computer 700 may include one or more instances of a physical computer-readable storage medium or media associated with the drives 730 or other storage devices. The system bus may enable the processor 710 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 720, whether characterized as RAM, ROM, flash, or other types of volatile or nonvolatile memory technology. The media may also represent secondary storage, whether implemented as the storage drives 730 or otherwise. Hard drive implementations may be characterized as solid state, or may include rotating media storing magnetically-encoded information.

The storage media may include one or more program modules 760. The program modules 760 may include software instructions that, when loaded into the processor 710 and executed, transform a general-purpose computing system into a special-purpose computing system. As detailed throughout this description, the program modules 760 may provide various tools or techniques by which the computer 700 may participate within the overall systems or operating environments using the components, logic flows, and/or data structures discussed herein.

The processor 710 may be constructed from any number of transistors or other circuit elements, which may individually or collectively assume any number of states. More specifically, the processor 710 may operate as a state machine or finite-state machine Such a machine may be transformed to a second machine, or specific machine by loading executable instructions contained within the program modules 760. These computer-executable instructions may transform the processor 710 by specifying how the processor 710 transitions between states, thereby transforming the transistors or other circuit elements constituting the processor 710 from a first machine to a second machine. The states of either machine may also be transformed by receiving input from the one or more user input devices 790, the network interface 796, other peripherals, other interfaces, or one or more users or other actors. Either machine may also transform states, or various physical characteristics of various output devices such as printers, speakers, video displays, or otherwise.

Encoding the program modules 760 may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, and the like. For example, if the storage media are implemented as semiconductor-based memory, the program modules 760 may transform the physical state of the semiconductor memory 720 when the software is encoded therein. For example, the software may transform the state of transistors, capacitors, or other discrete circuit elements constituting the semiconductor memory 720.

As another example, the storage media may be implemented using magnetic or optical technology such as drives 730. In such implementations, the program modules 760 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description.

Figure 8:
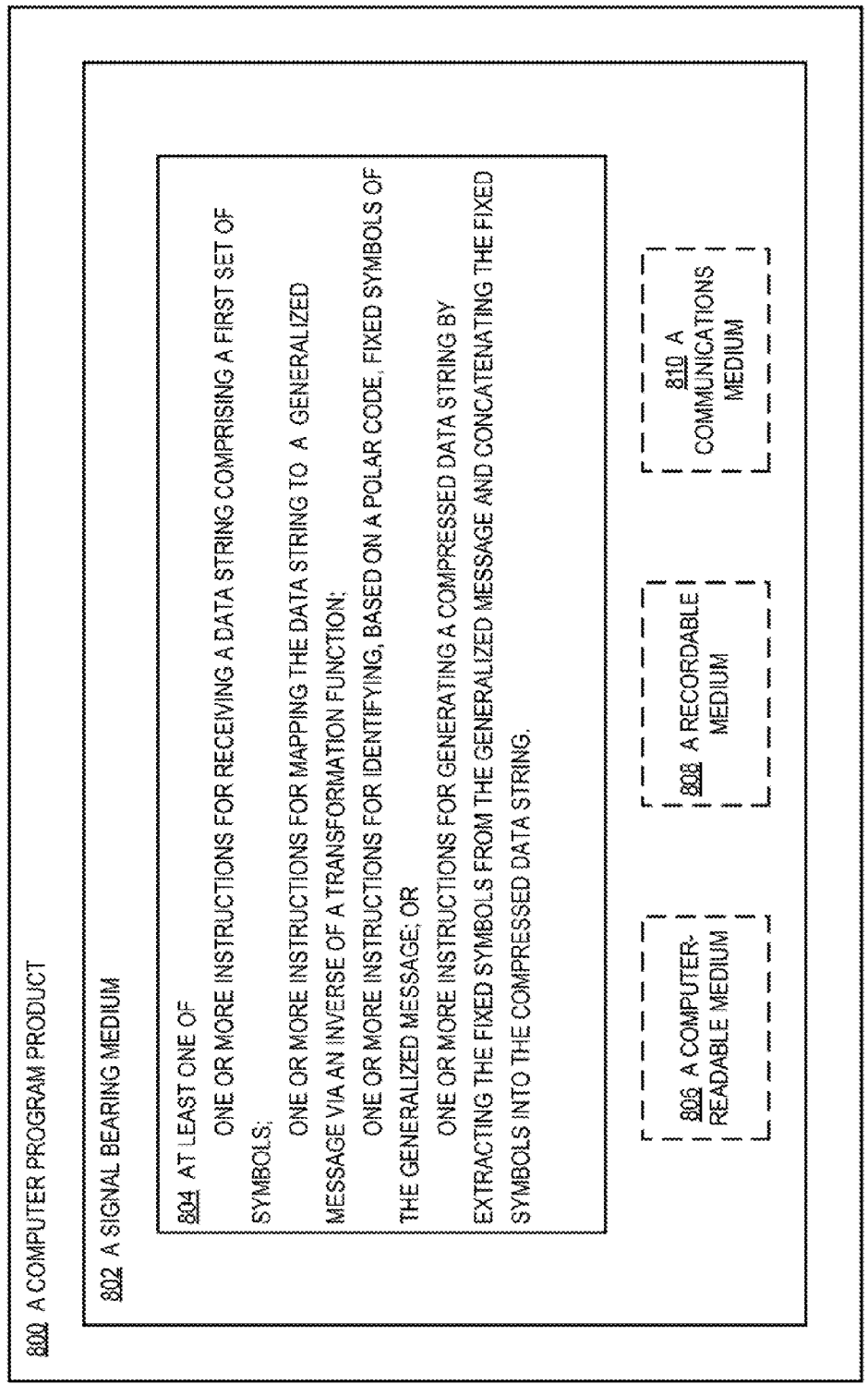
FIG. 8 is a schematic diagram illustrating a computer program product that includes a computer program for executing a computer process on a computing device.

FIG. 8 is a schematic diagram that illustrates a computer program product 800 that includes a computer program for executing a computer process on a computing device, arranged in accordance with at least some embodiments presented herein. An illustrative embodiment of the example computer program product is provided using a signal bearing medium 802, and may include at least one instruction of 804: one or more instructions for receiving a data string comprising a first set of symbols; one or more instructions for mapping the data string to a generalized message via an inverse of a transformation function; one or more instructions for identifying, based on a polar code, fixed symbols of the generalized message, or one or more instructions for generating a compressed data string by extracting the fixed symbols from the generalized message and concatenating the fixed symbols into the compressed data string.

In some embodiments, the signal bearing medium 802 of the one or more computer program products 800 include a computer readable medium 806, a recordable medium 808, and/or a communications medium 810.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multi-core processor systems, microprocessor-based or programmable consumer electronics, minicomputers, mainframe computers, and the like.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the Detailed Description, claims, or Figures, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for compressing and decompressing data, the method comprising:
   receiving a data string comprising a first set of symbols;
   transforming the data string into a generalized message comprising a second set of symbols by mapping the data string to the generalized message via an inverse of a transformation function;
   identifying, based on a polar code, fixed symbols of the generalized message;
   generating a compressed data string by extracting the fixed symbols from the generalized message and concatenating the fixed symbols into the compressed data string, thereby transforming the generalized message into the compressed data string;
   transforming the compressed data string into a recovered data string based on the polar code, wherein transforming the compressed data string into the recovered data string comprises:
   defining a base data string comprising zero values; and
   performing a polar decoding on the base data string to identify free symbols in a recovered generalized message; and
   verifying that the recovered data string matches the data string based on the polar code.

2. The method of claim 1, wherein the first set of symbols and the second set of symbols comprise a same quantity of symbols.

3. The method of claim 1, wherein the first set of symbols comprise a first set of bits; and wherein the second set of symbols comprise a second set of bits.

4. The method of claim 1, wherein the fixed symbols comprise a subset of the generalized message.

5. The method of claim 1, wherein mapping the data string to the generalized message via the inverse of the transformation function comprises:
   dividing the data string into a plurality of substrings;
   for each substring in the plurality of substrings, dividing the substring into an XOR substring and an even substring;
   performing an XOR operation on the XOR substring and the even substring to determine an odd substring; and generating at least a portion of the generalized message by combining the odd substring and the even substring, wherein the odd substring comprises odd numbered symbols in the portion of the generalized message, and wherein the even substring comprises even numbered symbols in the portion of the generalized message.

6. The method of claim 1, wherein transforming the compressed data string into the recovered data string further comprises:
generating the recovered generalized message by combining the compressed data string and the free symbols, thereby transforming the compressed data string into the recovered generalized message; and
transforming the recovered generalized message into the recovered data string by mapping the recovered generalized message to the recovered data string via the transformation function, wherein the recovered data string matches the data string.

7. The method of claim 6, wherein mapping the recovered generalized message to the recovered data string via the transformation function comprises:
dividing the recovered generalized message into an odd substring and an even substring, the odd substring comprising odd numbered symbols in the recovered generalized message, the even substring comprising even numbered symbols in the recovered generalized message;
performing an XOR operation on the odd substring and the even substring to determine an XOR substring; and
generating at least a portion of the recovered data string by concatenating the XOR substring and the even substring.

8. The method of claim 1, the method further comprising:
upon generating the compressed data string, decompressing the compressed data string to generate a decompressed data string and verifying that the decompressed data string matches the data string.

9. A non-transitory computer-readable medium having computer-executable instructions stored thereon which, when executed by a computer, cause the computer to:
receive a compressed data string comprising a first set of symbols;
define a base data string comprising zero values;
perform a polar decoding on the base data string to identify free symbols in a generalized message;
extract the free symbols from the generalized message based on a polar code utilized by the polar decoding;
generate the generalized message comprising a second set of symbols by combining the compressed data string and the free symbols, wherein the polar code defines positions of the free symbols in the generalized message, thereby transforming the compressed data string into the generalized message; and
transform the generalized message into a data string by mapping the generalized message to the data string via a transformation function.

10. The non-transitory computer-readable medium of claim 9, wherein to map the generalized message to the data string via the transformation function, the computer-readable medium comprising computer-executable instructions stored thereon which, when executed by the computer, further cause the computer to:
divide the generalized message into an odd substring and an even substring, the odd substring comprising odd numbered symbols in the generalized message, the even substring comprising even numbered symbols in the generalized message;
perform an XOR operation on the odd substring and the even substring to determine an XOR substring; and
generate at least a portion of the data string by concatenating the XOR substring and the even substring.

11. The non-transitory computer-readable medium of claim 9, further comprising computer-executable instructions stored thereon which, when executed by the computer, cause the computer to transform the data string into an original compressed data string.

12. The non-transitory computer-readable medium of claim 11, wherein to transform the data string into the original compressed data string, the computer-readable medium comprising computer-executable instructions stored thereon which, when executed by the computer, further cause the computer to:
map the data string to an original generalized message via an inverse of the transformation function, whereby the data string is transformed into the original generalized message;
identify, based on the polar code, fixed symbols of the original generalized message;
extract the fixed symbols from the original generalized message; and
when the fixed symbols are extracted from the original generalized message, concatenate the fixed symbols to generate the compressed data string, whereby the original generalized message is transformed into the original compressed data string.

13. The non-transitory computer-readable medium of claim 12, wherein to map the data string to the original generalized message via the inverse of the transformation function, the computer-readable medium comprising computer-executable instructions stored thereon which, when executed by the computer, further cause the computer to:
divide the data string into a plurality of substrings;
for each substring in the plurality of substrings, divide the substring into an XOR substring and an even substring,
perform an XOR operation on the XOR substring and the even substring to determine an odd substring; and
generate at least a portion of the original generalized message by combining the odd substring and the even substring, wherein the odd substring comprises odd numbered symbols in the portion of the original generalized message, and wherein the even substring comprises even numbered symbols in the portion of the original generalized message.

14. A computer system, comprising:
a processor;
a memory coupled to the processor; and
a program module which executes in the processor from the memory and which, when executed by the processor, causes the computer system to:
receive a data string comprising a first set of symbols,
transform the data string into a generalized message comprising a second set of symbols by mapping the data string to the generalized message via an inverse of a transformation function,
identify, based on a polar code, fixed symbols of the generalized message;
generate a compressed data string, by extracting the fixed symbols from the generalized message and concatenating the fixed symbols into the compressed data string, thereby transforming the generalized message into the compressed data string, transform the compressed data string into a recovered data string based on the polar code, wherein transform the compressed data string into the recovered data string comprises:
  define a base data string comprising zero values; and
  perform a polar decoding on the base data string to identify free symbols in a recovered generalized message; and
verifying that the recovered data string matches the data string based on the polar code.

15. The computer system of claim 14, wherein to map the data string to the generalized message via the inverse of the transformation function, the program module, when executed by the processor, further causes the computer system to
  divide the data string into a plurality of substrings;
  for each substring in the plurality of substrings, divide the substring into XOR substring and an even substring;
  perform an XOR operation on the XOR substring and the even substring to determine an odd substring; and
  generate at least a portion of the generalized message by combining the odd substring and the even substring, wherein the odd substring comprises odd numbered symbols in the portion of the generalized message, and wherein the even substring comprises even numbered symbols in the portion of the generalized message.

16. The computer system of claim 14, wherein to transform the compressed data string into the recovered data string, the program module, when executed by the processor, further causes the computer system to:
  generate the recovered generalized message b combining the compressed data string and the free symbols, thereby transforming the compressed data string into the recovered generalized message; and
  transform the recovered generalized message into the recovered data string, by mapping the recovered generalized message to the recovered data string via the transformation function.

* * * * *

UNITED STATES PATENT AND TRADEMARK OFFICE
CERTIFICATE OF CORRECTION

| | | |
|---|---|---|
| PATENT NO. | : 9,454,552 B2 | Page 1 of 1 |
| APPLICATION NO. | : 13/816075 | |
| DATED | : September 27, 2016 | |
| INVENTOR(S) | : Ma | |

It is certified that error appears in the above-identified patent and that said Letters Patent is hereby corrected as shown below:

In the specification

In Column 15, Line 39, delete "block 500," and insert -- block 510, --, therefor.

In Column 17, Line 41, delete "machine Such" and insert -- machine. Such --, therefor.

In the claims

In Column 21, Lines 25-26, in Claim 7, delete "comprising, even" and insert -- comprising even --, therefor.

In Column 22, Lines 39-40, in Claim 13, delete "substring, perform" and insert -- substring; perform --, therefor.

In Column 22, Line 63, in Claim 14, delete "string, by" and insert -- string by --, therefor.

In Column 23, Line 15, in Claim 15, delete "system to" and insert -- system to: --, therefor.

In Column 23, Line 18, in Claim 15, delete "into XOR" and insert -- into an XOR --, therefor.

In Column 24, Line 11, in Claim 16, delete "message b combining" and insert -- message by combining --, therefor.

In Column 24, Line 16, in Claim 16, delete "string, by" and insert -- string by --, therefor.

Signed and Sealed this
Twentieth Day of December, 2016

Michelle K. Lee
*Director of the United States Patent and Trademark Office*